United States Patent [19]
Tani et al.

[11] Patent Number: 5,612,121
[45] Date of Patent: Mar. 18, 1997

[54] CONDUCTIVE PASTES, CONDUCTIVE MATERIALS AND MULTI-LAYERED CERAMIC SUBSTRATES USING SAME

[75] Inventors: Hiroji Tani; Kazuhito Oshita, both of Kyoto, Japan

[73] Assignee: Murata Manufacturing Co., Ltd., Japan

[21] Appl. No.: 565,686

[22] Filed: Dec. 1, 1995

[30] Foreign Application Priority Data

Dec. 2, 1994 [JP] Japan .................................. 6-299756

[51] Int. Cl.⁶ ........................................................ B32B 9/00
[52] U.S. Cl. .......................... 428/210; 428/432; 428/433; 174/251
[58] Field of Search .................... 428/210, 432, 428/433; 174/251

[56] References Cited

U.S. PATENT DOCUMENTS

| | | | |
|---|---|---|---|
| 3,892,904 | 7/1975 | Tanaka | 428/210 |
| 4,020,206 | 4/1977 | Beil | 428/137 |
| 4,070,518 | 1/1978 | Hoffman | 428/209 |
| 4,766,027 | 8/1988 | Burn | 428/210 |
| 4,775,596 | 10/1988 | Holleran et al. | 428/210 |
| 4,795,670 | 1/1989 | Nishigahi et al. | 428/210 |
| 5,082,804 | 1/1992 | Prabhu et al. | 501/19 |
| 5,232,765 | 8/1993 | Yano et al. | 428/195 |
| 5,439,732 | 8/1995 | Nagasaka et al. | 428/210 |

FOREIGN PATENT DOCUMENTS

| | | |
|---|---|---|
| 4-28109 | 5/1990 | Japan . |
| 6-97667 | 9/1992 | Japan . |

*Primary Examiner*—Patrick Ryan
*Assistant Examiner*—Cathy F. Lam
*Attorney, Agent, or Firm*—Majestic Parsons Siebert & Hsue

[57] ABSTRACT

An electrically conductive paste for use as a conductive material for the production of multi-layered ceramic substrates is formed with an organic vehicle and electrically conductive Cu particles mixed with Ag or Bi particles at a rate within a specified range. An electrically conductive material is obtained by subjecting such a paste to a firing process. A multi-layered ceramic substrate is obtained by forming circuits on ceramic sheets with such a paste, stacking them one on top of another and subjecting the layered structure to a firing process.

8 Claims, 1 Drawing Sheet

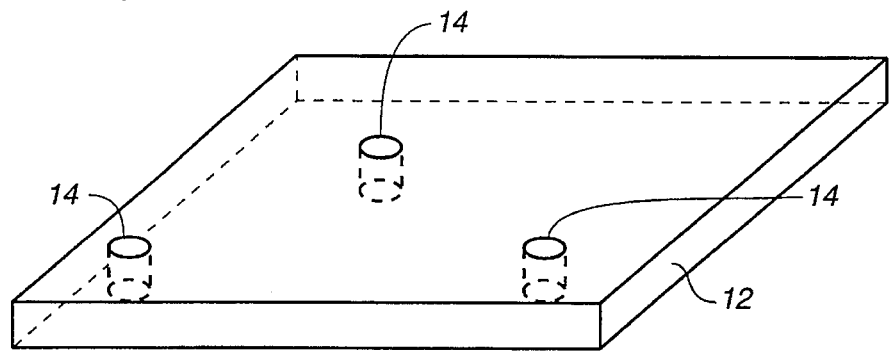
FIG._1A
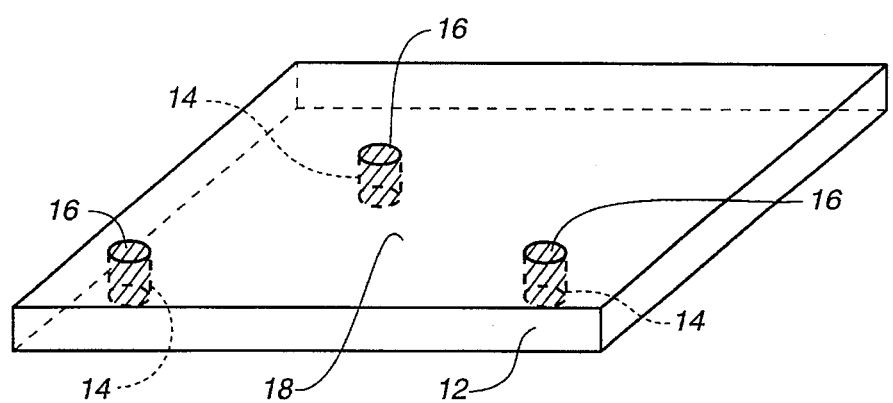
FIG._1B
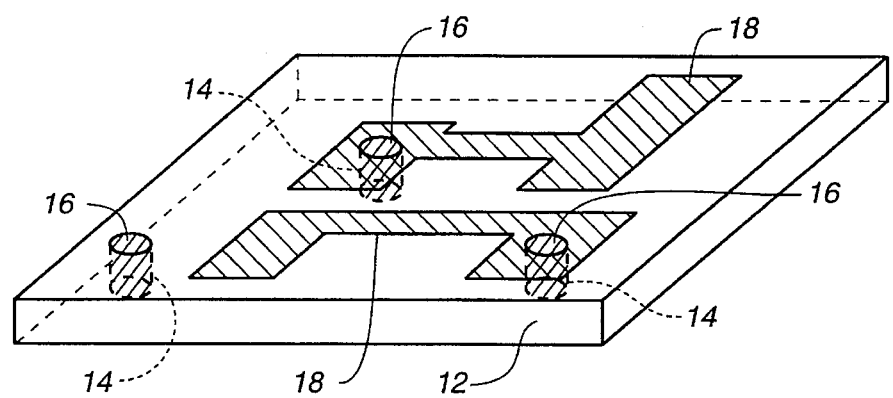
FIG._1C
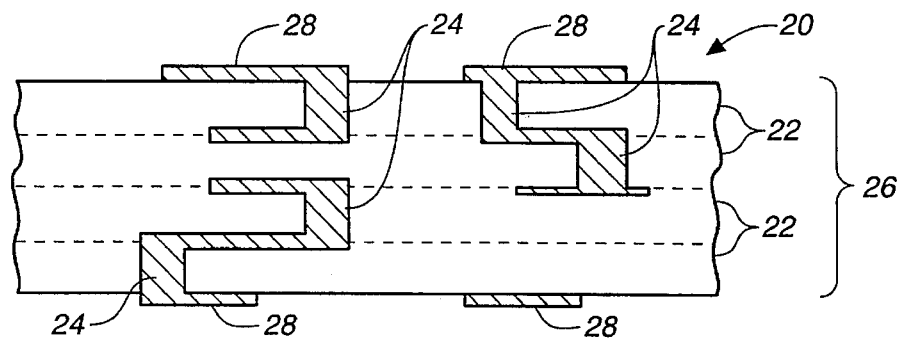
FIG._2

CONDUCTIVE PASTES, CONDUCTIVE MATERIALS AND MULTI-LAYERED CERAMIC SUBSTRATES USING SAME

BACKGROUND OF THE INVENTION

This invention relates to electrically conductive pastes (herein referred to simply as "conductive pastes") which can be useful as a conductive material for the production of multi-layered ceramic substrates, as well as conductive materials and multilayered ceramic substrates themselves produced by using such a paste.

Ceramic substrates are being used commonly for mounting many kinds of electronic components to form an electronic circuit in order to produce compact electronic devices and instruments. In order to further increase the mounting density, it is becoming a common practice to stack a plurality of ceramic green sheets with circuit patterns formed on their surfaces by using a paste containing a conductive substance and to form an integral multi-layered structure by a firing process. In order to make electrical connections between such ceramic sheets, viaholes are initially formed through the ceramic green sheets by using a drill or a puncher and are filled with a conductive paste. Circuits are formed on the surfaces of the green sheets, for example, by a screen-printing process by using such a conductive paste. After the green sheets are thus prepared, they are stacked one on top of another, compressed, cut to an appropriate size and then subjected to a firing process. The conductive paste, both inside the viaholes and on the green sheets, is sintered at the same time such that the circuits inside the multi-layered ceramic substrate become connected.

As electrically conductive particles which are mixed in to form such pastes, use is frequently made of Cu because it has low specific resistance, because migration does not occur easily and also because it is inexpensive. Particles of Cu or an alloy of Cu are mixed and dispersed within an organic vehicle such as ethyl cellulose resin. As an example of paste with a Cu alloy, Japanese Patent Publication Tokkai 4-28109 has disclosed a paste comprising particles of an Ag/Cu/M alloy (where M is one or more selected from Pb, Bi and Sn) and an organic vehicle, having improved properties in electric conductivity, resistance against oxidation, solderability and resistance against migration. Japanese Patent Publication Tokkai 6-97667 has disclosed another paste for multi-layered substrates formed by a low-temperature firing process, comprising particles of an Ag/Cu alloy with increased Ag density on the surface, glass frit and an organic vehicle, having improved properties in electric conductivity, adhesion to green sheets, resistance against oxidation and resistance against migration.

In summary, prior art multi-layered ceramic substrates are produced by subjecting ceramic green sheets and a Cu paste or a Cu alloy paste to a firing process simultaneously. When subjecting a Cu paste to a firing process, however, the temperature must be kept below the melting point of Cu, or at about 1000° C. As a result, the conductive particles between the multilayered ceramics and inside the viaholes cannot easily be sintered or become a densely packed structure. This tends to leave gaps (or "pores") inside the conductor, causing poor conductivity and adversely affecting the reliability of the substrate.

A similar result is obtained also when a paste with a Cu alloy is used. In the case of a Cu alloy paste also containing particles of a metal having a low melting point such as Ag, the temperature of the firing process must be kept even lower since the melting point of such an alloy is lower than that of Cu. In other words, the sintering of the alloy cannot be carried out effectively by the firing process.

SUMMARY OF THE INVENTION

It is therefore an object of this invention to provide a conductive paste which is capable, when used as a conductive material in the production of a multilayered ceramic substrate, of reliably providing conductive materials of a densely packed structure between the multi-layered ceramics and inside viaholes.

It is another object of this invention to provide conductive materials and multi-layered ceramic substrates obtained by using such a paste.

Conductive pastes according to this invention, with which the above and other objects can be accomplished, may be characterized as comprising electrically conductive particles and an organic vehicle, the conductive particles being a mixture containing Cu and Ag particles or Cu and Bi particles at a ratio within a specified range. Conductive materials and multi-layered ceramic substrates according to this invention are characterized as being formed by using such a paste.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIGS. 1A, 1B and 1C are schematic drawings for showing a ceramic sheet at various stages in the production of a multi-layered ceramic substrate embodying this invention; and FIG. 2 is a sectional view of a portion of a multi-layered ceramic substrate according to this invention.

DETAILED DESCRIPTION OF THE INVENTION

This invention relates to conductive pastes comprising electrically conductive particles and an organic vehicle, these conductive particles being a mixture containing Cu particles by 90–99.5 weight % and Ag particles by 0.5–10 weight %. The average diameters of the Cu and Ag particles of such a paste are preferably 0.5–30 μm and 0.5–5 μm, respectively.

This invention also relates to electrically conductive materials formed (say, as a film) by mixing and subjecting to a firing process a mixture containing cu particles by 90–99.5 weight % and Ag particles by 0.5–10 weight %. This invention further relates to multi-layered ceramic substrates comprising a plurality of ceramic sheets stacked one on top of another and electrically conductive material serving as circuits formed therebetween by subjecting to a firing process a mixture containing Cu particles by 90–99.5 weight % and Ag particles by 0.5–10 weight %.

This invention additionally relates to conductive pastes comprising electrically conductive particles and an organic vehicle, these conductive particles being a mixture containing Cu particles by 95–99.9 weight % and Bi particles by 0.1–5 weight %. The average diameters of the Cu and Bi particles of such a paste are preferably 0.5–30 μm and 0.5–5 μm, respectively.

This invention also relates to electrically conductive materials formed (say, as a film) by mixing and subjecting to a firing process a mixture containing Cu particles by 95–99.9 weight % and Bi particles by 0.1–5 weight %. This invention further relates to multi-layered ceramic substrates comprising a plurality of ceramic sheets stacked one on top of another and electrically conductive material serving as circuits formed therebetween by subjecting to a firing process a mixture containing Cu particles by 95–99.9 weight % and Bi particles by 0.1–5 weight %.

If a conductive paste of this invention is subjected to a firing process, the temperature at which the sintering of Cu begins to take place becomes lower as Ag or Bi is melted. This has the effect of accelerating the sintering of Cu during the firing process, and the conductive material between the layered ceramic sheets and inside the viaholes therethrough becomes densely packed. If the diameters of the conductive particles are within the specified ranges according to this invention, furthermore, the particles can react and fill the viaholes more uniformly and generation of gaps inside the conductive material between the layered ceramic sheets and inside the viaholes can be prevented more reliably.

Next, the invention is described more in detail by way of examples.

As a ceramic material, a composite $BaO$—$Al_2O_3$—$SiO_2$ based glass material was prepared. An organic binder such as polyvinyl butyral and an organic solvent such as toluene were mixed to particles of this glass material to obtain a slurry. The slurry thus obtained was made into the form of a sheet by means of a doctor blade to produce ceramic green sheets shown at 12 in FIG. 1A. Viaholes 14 were formed through these ceramic green sheets 12 by means of a puncher.

To produce conductive pastes embodying this invention, Cu particles with average diameter of 0.5 μm, 3 μm, 10 μm and 30 μm and Ag and Bi particles with average diameter of 0.5 μm, 1 μm, 5 μm and 10 μm were prepared. An organic vehicle comprised of an organic binder containing ethyl cellulose resin and alkyd resin and a solvent such as terpineol was added to different mixtures of such electrically conductive particles, and conductive pastes shown in Table 1 were produced by using a three-roll mill to mix them together. These mixtures contained 10–100 weight parts of the organic vehicle against 100 weight parts of conductive particles.

Next, the viaholes 14 in the ceramic green sheets 12 (only one of the sheets being shown in FIG. 1B) were filled with one of these conductive pastes (indicated by numerals 16).

After it was dried, the same paste was used to form circuit patterns 18 on the ceramic green sheets 12, as shown in FIG. 1C (only one of the sheets being shown), by screen printing. A plurality of these ceramic green sheets 12 were stacked one on top of another, compressed together and cut to a specified size. They were thereafter subjected to a firing process at 900°–1000° C. for 1–2 hours within a $N_2$ atmosphere to obtain a multi-layered ceramic substrate having a conductive material inside the viaholes and between the layered sheets.

FIG. 2 is a sectional view of a portion of a multi-layered ceramic substrate 20 thus produced, embodying the invention and comprising a plurality of ceramic sheets 22 obtained by subjecting the green sheets 12 (shown in FIG. 1C) to a firing process. These ceramic sheets 22 are fused together by the firing process and now form an integral layered structure 26. Each ceramic sheet 22 is provided with viaholes 24 filled with a conductive material 28 obtained by firing the conductive paste 16 (as shown in FIGS. 1B and 1C). The conductive material 28 is also formed as circuit patterns on the outer surfaces of the layered structure 26 as well as between the ceramic sheets 22.

Parts with a viahole and the conductive material between layered sheets of the substrate were examined for the presence or absence of gaps (or "pores") by observing sectional surfaces with an optical microscope. The results of this observation are also shown in Table 1. In Table 1, symbols "*" indicate samples which are not according to this invention. Symbols "**" corresponding to Samples 5 and 12 indicate that the conductive material in viaholes or between the layered sheets became melted to form small spherical bodies due to surface tension, causing an open circuit condition.

Table 1 clearly shows that densely packed viaholes and conductive material between layered ceramic sheets can be obtained if a conductive paste containing cu particles by 90–99.5 weight % and Ag particles by 0.5–10 weight % is used as conductive material for a multi-layered ceramic substrate.

If the ratio of Cu particles is less than 90 weight % and that of Ag particles exceeds 10 weight %, the conductive material is melted and forms small spheres, causing an open circuit condition, as indicated by Sample No. 5. If the ratio of Cu particles exceeds 99.5% and that of Ag particles is less than 0.5 weight %, on the other hand, the effect by the addition of Ag particles to lower the sintering temperature of the Cu particles cannot be observed.

TABLE 1

| No. | Cu particles (Average diameter (μm))/ (weight %) | Ag particles (Average diameter (μm))/ (weight %) | Bi particles (Average diameter (μm))/ (weight %) | Firing Temp. (°C.) | Gaps Viaholes | Gaps Between layers |
|---|---|---|---|---|---|---|
| 1* | 3/100 | — | — | 950 | Yes | Yes |
| 2 | 0.5/99 | 0.5/1 | — | 900 | No | No |
| 3 | 3/99.5 | 1/0.5 | — | 1000 | No | No |
| 4 | 3/90 | 1/10 | — | 950 | No | No |
| 5* | 3/80 | 1/20 | — | 950 | ** | ** |
| 6 | 10/95 | 5/5 | — | 950 | No | No |
| 7 | 30/90 | 5/10 | — | 950 | No | No |
| 8 | 10/95 | 10/5 | — | 950 | Some | Some |
| 9 | 3/97.5 | — | 0.5/2.5 | 950 | No | No |

TABLE 1-continued

| No. | Cu particles (Average diameter (μm))/ (weight %) | Ag particles (Average diameter (μm))/ (weight %) | Bi particles (Average diameter (μm))/ (weight %) | Firing Temp. (°C.) | Gaps Via-holes | Between layers |
|---|---|---|---|---|---|---|
| 10 | 3/99.9 | — | 1/0.1 | 950 | No | No |
| 11 | 3/95 | — | 1/5 | 950 | No | No |
| 12* | 3/90 | — | 1/10 | 950 | ** | ** |
| 13 | 10/97.5 | — | 5/2.5 | 950 | No | No |
| 14 | 30/95 | — | 5/5 | 950 | No | No |
| 15 | 10/97.5 | — | 10/2.5 | 950 | Some | Some |

If the average diameter of the Cu particles is 0.5–30 μm and that of the Ag particles is 0.5–5 μm, generation of gaps (or pores) can be more successfully prevented and more densely packed viaholes and conductive material between the layers can be obtained. If the average diameter of the Cu or Ag particles is less than 0.5 μm, thixotropicity of the conductive paste is increased. This has the effect of lowering its fluidity, and the viaholes are not filled effectively with the paste. If the average diameter of the Cu particles exceeds 30 μm, on the other hand, the screen printing process cannot be carried out effectively because of the coarseness of the particles. If the average diameter of the Ag particles exceeds 5 μm, gaps tend to appear in the viaholes and the conductive material between the layered sheets, as shown by Sample No. 8, probably because of the unevenness in the reaction.

Table 1 also shows clearly that densely packed viaholes and conductive material between ceramic layers can be obtained if a conductive paste containing Cu particles by 95–99.9 weight % and Bi particles by 0.1–5 weight % is used as conductive material for a multilayered ceramic substrate.

If the ratio of Cu particles is less than 95 weight % and that of Bi particles exceeds 5 weight %, the conductive material is melted and forms small spheres, causing an open circuit condition, as indicated by Sample No. 12. If the ratio of Cu particles exceeds 99.9% and that of Bi particles is less than 0.1 weight %, on the other hand, the effect by the addition of Bi particles to lower the sintering temperature of the Cu particles cannot be observed.

If the average diameter of the Cu particles is 0.5–30 μm and that of the Bi particles is 0.5–5 μm, generation of gaps (or pores) can be more successfully prevented and more densely packed viaholes and conductive material between the layers can be obtained. If the average diameter of the Cu or Bi particles is less than 0.5 μm, thixotropicity of the conductive paste is increased. This has the effect of lowering its fluidity, and the viaholes are not filled effectively with the paste. If the average diameter of the Cu particles exceeds 30 μm, on the other hand, the screen printing process cannot be carried out effectively because of the coarseness of the particles. If the average diameter of the Bi particles exceeds 5 μm, gaps tend to appear in the viaholes and the conductive material between the layered sheets, as shown by Sample No. 15, probably because of the unevenness in the reaction.

Although the use of only an organic vehicle for a paste comprising an organic binder with ethyl cellulose resin and alkyd resin and a terpineol solvent was disclosed above, this is not intended to limit the scope of the invention. A choice may be made otherwise from organic vehicles commonly used for a thick-film paste, depending on the combination of ceramic green sheets and the binder.

Specifically, a paste comprising ethyl cellulose resin and a terpineol solvent, a paste comprising acrylic resin and a termineol solvent and a paste comprising butyral resin and an alcohol solvent can be used.

In addition, an electrically conductive paste of the present invention can be sintered by itself at a temperature in the range of about 500° to 1000° C. in order to form an electrically conductive material. Therefore, in the case where ceramic green sheets made of a ceramic material other than the material explained above is used, a multi-layered ceramic substrate of can be prepared according to the present invention by sintering the green sheets and the electrically conductive paste therebetween at a temperature in the range of about 830° to 1000° C.

In summary, conductive pastes containing conductive particles according to this invention may be regarded as a Cu paste containing Ag or Bi particles added to it such that the temperature at which the sintering of Cu starts is shifted in the direction of lower temperatures. If such a paste is used as the conductive material for a multi-layered ceramic substrate, the sintering of Cu is accelerated and the conductive material between the layered sheets and inside the viaholes can be densely packed. If the diameters of the particles of the conductive particles are within a specified range according to this invention, furthermore, the conductive material between the layered sheets and inside the viaholes can be even more densely packed. With a conductive material obtained by firing a conductive paste of this invention, it is possible to obtain multi-layered ceramic substrates with densely packed viaholes and conductive material between the layered sheets which remain conductive with improved reliability. Since individual metal particles and an organic vehicle are mixed together without the presence of any alloy particles, conductive pastes of this invention can be obtained more easily and more inexpensively.

What is claimed is:

1. An electrically conductive paste comprising an organic vehicle and electrically conductive particles dispersed therein, said electrically conductive particles including Cu particles by 90–99.5 weight % and Ag particles by 0.5–10 weight %.

2. The electrically conductive paste of claim 1 wherein the average diameter of said Cu particles is 0.5–30 μm and the average diameter of said Ag particles is 0.5–5 μm.

3. An electrically conductive material obtained by subjecting to a firing process a mixture containing Cu particles by 90–99.5 weight % and Ag particles by 0.5–10 weight %.

4. A multi-layered ceramic substrate comprising:
   a plurality of ceramic sheets stacked one on top of another; and electrically conductive material serving as circuits between said ceramic sheets, said conductive material being formed by subjecting to a firing process a mixture containing Cu particles by 90–99.5 weight % and Ag particles by 0.5–10 weight %.

5. An electrically conductive paste comprising an inorganic vehicle and electrically conductive particles dispersed therein, said electrically conductive particles including Cu particles by 95–99.9 weight % and Bi particles by 0.1–5 weight %.

6. The electrically conductive paste of claim 5 wherein the average diameter of said Cu particles is 0.5–30 μm and the average diameter of said Bi particles is 0.5–5 μm.

7. An electrically conductive material formed by subjecting to a firing process a mixture containing Cu particles by 95–99.9 weight % and Bi particles by 0.1–5 weight %.

8. A multi-layered ceramic substrate comprising:
a plurality of ceramic sheets stacked one on top of another; and
electrically conductive material serving as circuits between said ceramic sheets, said conductive material being formed by subjecting to a firing process a mixture containing Cu particles by 95–99.9 weight % and Bi particles by 0.1–5 weight %.

* * * * *